United States Patent [19]

Malloy

[11] Patent Number: 4,866,375
[45] Date of Patent: Sep. 12, 1989

[54] UNIVERSAL TEST FIXTURE

[76] Inventor: James T. Malloy, 13811 Euclid Ave., Garden Grove, Calif. 92643

[21] Appl. No.: 873,171

[22] Filed: Jun. 2, 1986

Related U.S. Application Data

[63] Continuation-in-part of Ser. No. 623,422, Jun. 22, 1984, abandoned.

[51] Int. Cl.$^4$ ...................... G01R 31/02; G01E 15/12
[52] U.S. Cl. ........................... 324/158 F; 324/73 PC; 324/73 AT
[58] Field of Search ........... 324/158 F, 158 P, 73 PC, 324/73 AT; 339/75 M, 117 P; 439/482, 824

[56] References Cited

U.S. PATENT DOCUMENTS

| | | | |
|---|---|---|---|
| 4,357,575 | 11/1982 | Uren et al. | 324/158 F X |
| 4,471,298 | 9/1984 | Frohlich | 324/158 F X |
| 4,506,215 | 3/1985 | Coughlin | 324/158 P |
| 4,518,910 | 5/1985 | Hottenrott et al. | 324/158 P X |
| 4,523,144 | 6/1985 | Okubo et al. | 324/72.5 X |
| 4,527,119 | 7/1985 | Rogers et al. | 324/158 F X |
| 4,532,423 | 7/1985 | Tojo et al. | 324/158 F X |
| 4,535,536 | 8/1985 | Wyss | 324/158 F |
| 4,590,422 | 5/1986 | Milligan | 324/158 F X |
| 4,633,176 | 12/1986 | Reimer | 324/73 PC X |
| 4,668,041 | 5/1987 | La Komski et al. | 324/158 F X |
| 4,686,467 | 8/1987 | DeLapp et al. | 324/158 F X |
| 4,724,377 | 2/1988 | Maelzer et al. | 324/158 F X |

FOREIGN PATENT DOCUMENTS

0194695 9/1986 European Pat. Off. ........ 324/158 P

Primary Examiner—Reinhard J. Eisenzopf
Assistant Examiner—Vinh P. Nguyen
Attorney, Agent, or Firm—Whann & Connors

[57] ABSTRACT

Disclosed is a test fixture which electrically tests units which have on-grid and off-grid test sites defined by holes. The central feature of this test fixture is the use of an array of flexible test probes which are arranged in an on-grid configuration. Each probe has a conical tip which is inserted into the hole, ahead at the end of a shaft which engages electrical test equipment, and a flexible shaft which connects the head to the tip. A table provides a generally flat surface which is moved in two directions in the same plane, generally at 90° relative to each other. The unit being tested is placed on the surface of the table so that the test sites are presented to the probes and are aligned so that the test sites which are on-grid are in registration with the tips of the test probes. The probes and unit are brought into engagement with each other and the table is actuated. The probes tips slide freely over the surface of the unit being tested and, when they pass a hole, drop into it. The table is moved in a zig zag manner, a pre-determined distance in the X and Y directions, so that the probe's shaft is not bent beyond its elastic limit. Thus, when the probe is withdrawn from the hole, the shaft will flex and return to its on-grid position. When all of the probes have been captured in the correct holes or test sites, the electrical test is conducted and then the unit and probes disengage.

12 Claims, 9 Drawing Sheets

UNIVERSAL TEST FIXTURE

RELATED PATENT APPLICATION

This application is a continuation-in-part application of

U.S. patent application Ser. No. 06/623,422, entitled Universal Probe Head, filed June 22, 1984 now abandoned. This previously filed patent application, which is incorporated herein by reference and made part of this patent application, discloses an experimental version of this invention.

BACKGROUND OF THE INVENTION

1. Field of the Invention

This invention relates to test fixtures used in testing circuit boards and the like and, particularly, a test fixture adapted to make electrical contact with test sites which are both on-grid and off-grid.

2. Background Discussion

Circuit boards are commonly used devices in a vast number of electronic instruments. These circuit boards carry metal pathways which constitute circuits. In making these boards, either one or both sides of an insulator sheet is clad with metal and then a resist material is coated on the surface to outline the desired conductive pathway or circuit. The exposed metal is then leached away with an acid solution and then the resist material is dissolved to form the circuit, which may include enlarged portions called pads. Commonly, holes are drilled through the pads and the interior of the hole is sometimes clad with metal. These pads and holes normally constitute points where various electronic devices are attached to the board.

To insure the quality of these circuit boards, electronic testing equipment has been developed to automatically test circuits between any two test sites by physically contacting each test site with a metal probe and then passing electricity through the probes so that the electricity flows along the circuit between the two selected test sites. This flow of electricity indicates that the circuit between the test sites is properly functioning.

One type of electronic testing equipment employs a probe head including an array of probes arranged in a grid configuration. Each probe is positioned at an intersection of coordinates of the grid, and is wired to an electronic analyzer. The grid is simply a number of spaced apart X and Y coordinates were the spacing between coordinates is known. Thus, the wired probes have known grid positions. The positions of test sites on the circuit board, however, may not have the same grid configuration as the wired probes.

For a circuit board of a particular design, the test sites will be arranged in a unique pattern. In order to make electrical contact between the test sites on the circuit board and the wired probes in the probe head, an interface fixture is used. Each circuit board having this same pattern can be tested using the same interface fixture. However, when another circuit board having test sites arranged in a different pattern is to be tested, a new interface fixture must be used. In other words, each circuit board design requires a custom made interface fixture. The cost of the interface fixture is amortized over the number of boards tested. Thus, when a great number of boards are to be tested, the cost of the interface fixture is relatively inexpensive. However, if only a few circuit boards are to be tested, the interface fixture is very expensive and may even be prohibitive.

MAJOR FEATURES OF THE INVENTION

One principal feature of the test fixture of the present invention is that it is adapted to test a variety of circuit board designs having different test site patterns. Such a test fixture eliminates the need to build a custom made interface fixture for each circuit board test site pattern. In other words, the test fixture of the present invention may be considered a universal test fixture which can be used to test virtually any test pattern on a circuit board, provided that the distance between the test sites being tested is equal to or greater than the minimal spacing between grid coordinates. Thus, the chief advantage of this invention is a substantial cost savings when it is desired to test a wide variety of circuit boards having different test site patterns even though the number of circuit boards to be tested is small.

The test fixture of the present invention has several distinguishing features. First, it employs a plurality of flexible probes which are disposed in support means and adapted to move in and out of the support means. The use of such flexible probes is unique. Each individual probe is capable of bending, moving from an on-grid to an off-grid position, and then after the test is completed, springing back to its original on-grid position. Second, the probes may be utilized in two different ways: (1) a flexible probe is disposed in the support means opposite each individual wired probe in the electronic test equipment; or (2) the flexible probes will be positioned in the support means only opposite those wired probes in the probe head electronic test which correspond to a test site on the circuit board under test. In the former case, the support means is the only loaded once, fully loading it with probes so the number of probes in the support means equals the number of wired probes in the electronic testing equipment. In this situation, a mask is employed which is disposed between the circuit board being tested and the array of flexible probes. There will be openings in the mask opposite those flexible probes which should contact a corresponding test site. Where no test is to be conducted, the mask provides a barrier which prevents flexible probes from contacting the circuit board. In this arrangement, the support means is only loaded once. In the latter arrangement, the support means must be loaded with flexible probes each time a circuit board is to be tested, arranging the probes in a pattern corresponding to the pattern of the test sites.

Once the support means is loaded with flexible probes, the probes are brought into contact with the circuit board and a drive mechanism is actuated to move the circuit board and probes relative to one another so that each point on the circuit board moves through a predetermined path. This moves each test site through a predetermined field of search which will bring the test site past a probe located within the test site's field of search. When the probe is opposite the test site, it moves into the hole defining the test site. Continual movement of the circuit board results in any flexible probe inserted into a hole to bend. This movement is maintained within limits so that the flexible probe is not bent beyond its elastic limit. When all the flexible probes have been properly positioned in the holes, the wired probes of the probe head contact the flexible probes and current is passed through the flexible probes and the test sites to electrically test the circuits of the circuit board.

The design of the flexible probe is also an important feature of this invention. Each flexible probe comprises an elongated shaft having one end connected to a shank and another end formed into a tip, preferably of a conical shape. The shank has an enlarged head, and the shaft will pivot or bend at the point where it joins the shank. The shaft acts as a beam, flexing about its point of connection with the shank in any direction. This shaft must be capable to extending outwardly without exceeding its elastic limit a distance that enables the tip of the probe to search a designated area. The probe is made of conductive material such as, for example, beryllium copper. The base of a conical tip has a diameter which does not exceed 45% of the minimal distance between adjacent coordinants. For example, if all the X coordinants are spaced apart 0.100 inch, the diameter of the base of the conical tip is 0.045 inch maximum. It may be less than this, but not less than the diameter of the hole defining the test site.

The different embodiments of this invention illustrating all its features will now be discussed in detail. These embodiments show the invention where the probes are in a "down" configuration. That is as they move past a hole, they resond to gravity and drop into the hole. This is the simplest way to insert the probe into the hole. Other arrangements are possible, however. In such instances a spring would be used to insert the probe into the hole when registration is achieved.

BRIEF DESCRIPTION OF THE DRAWING

The present invention is illustrated in the drawing, in which like parts are indicated by like numerals, and.

DESCRIPTION OF PREFERRED EMBODIMENTS

General

Figure 23:
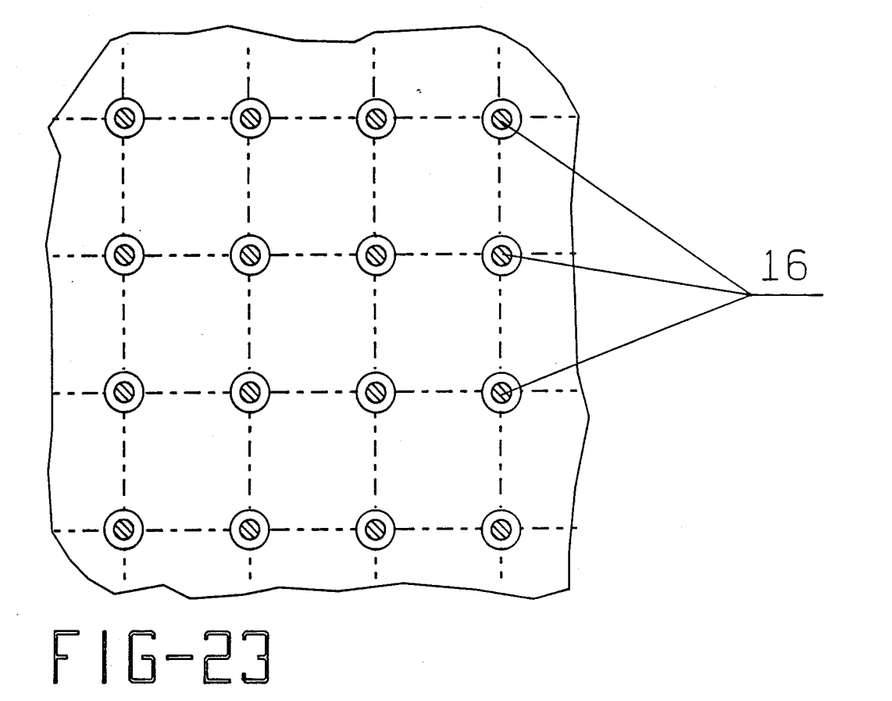
FIG. 23 shows the flexible probes arranged in a grid configuration.

The test fixture 10 of the present invention is housed in a cabinet 12 and used to electrically test a circuit board (FIG. 2), the unit 14 under test. The test fixture 10 includes a plurality of flexible probes 16 which are arranged in a predetermined grid configuration (FIG. 23). These probes 16 are held by a support plate 18, but are free to move in and out relative to this plate. Housed within the cabinet 12 are a plurality of wired probes 20 (FIG. 2) above the flexible probes 16 which, when the electrical test is being conducted, engage the flexible probes. Electrical current flows through the wired probes 20 and flexible probes 16 to the test sites on the unit 14. In the embodiment illustrated in FIG. 9, the test sites are beneath opening 24a in a mask 24 covering the top surface of the unit 14.

Figure 2:
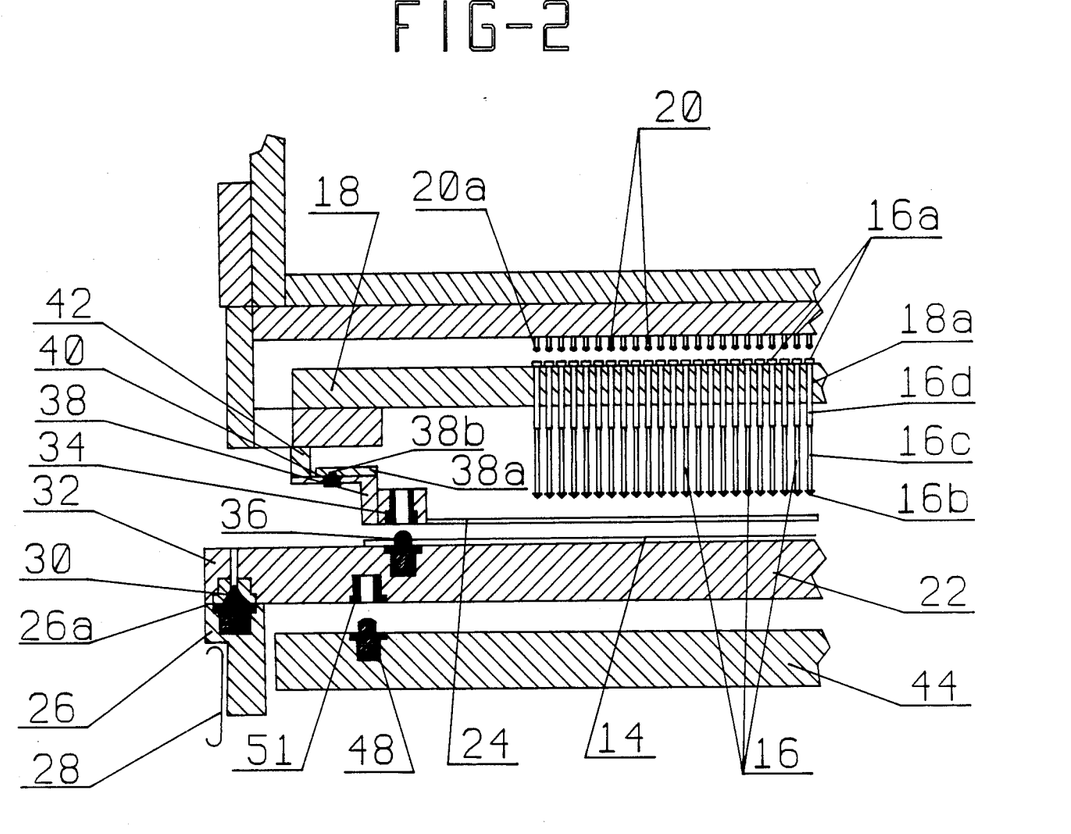
FIG. 2 is a cross-sectional view of an end portion of test fixture of the present invention.
Figure 3:
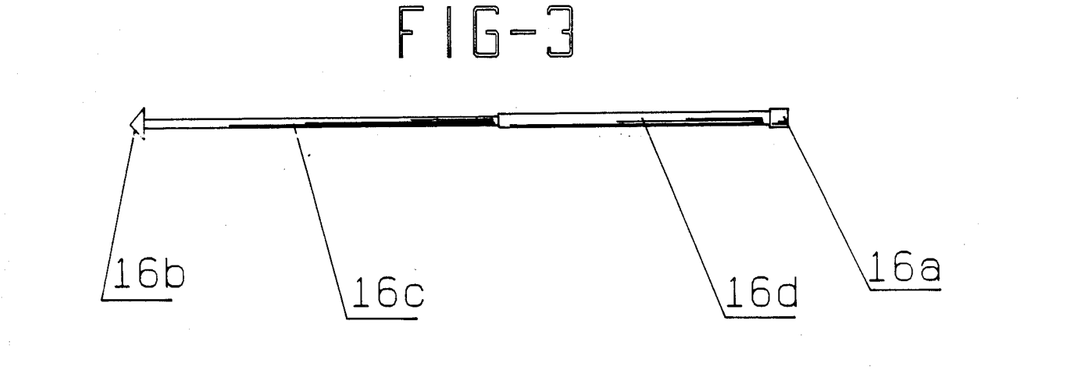
FIG. 3 is a side view of one of the flexible test probes of the present invention.
Figures 4, 5:
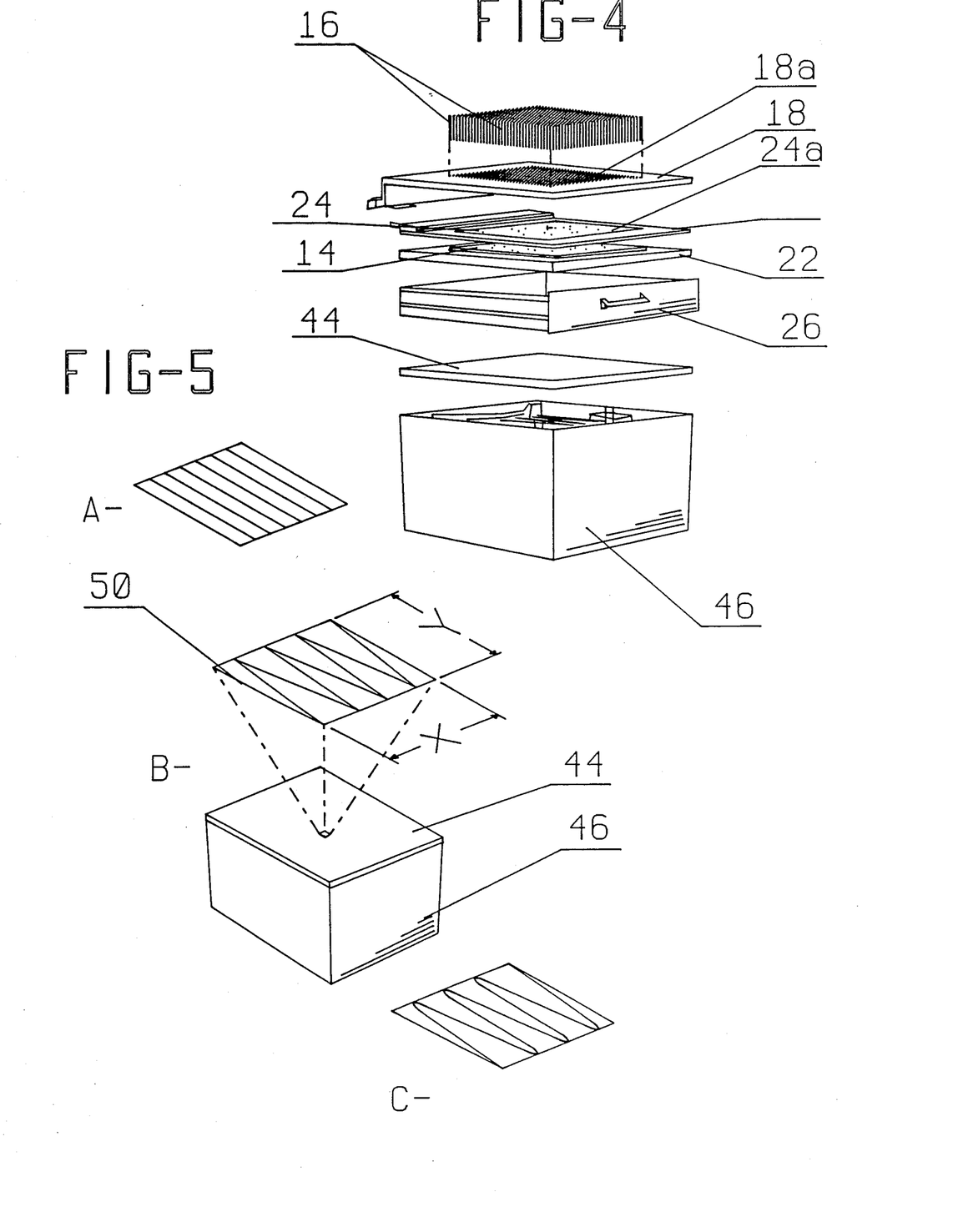
FIG. 4 is an exploded, isometric view of the major components test fixture of the present invention.
FIG. 5 is a schemmatic view illustrating the movement of a test site through its field of search, with path A showing square wave movement, path B showing zig zag movement, and path C showing sinusodial movement.

As best depicted in FIGS. 2, 3 and 4, the flexible probes 16 extend downwardly and outwardly from the support plate 18, which has openings 18a drilled therein which enable the flexible probes to pass through the plate. Each flexible probe 16 includes an enlarged head 16a at one end, a conical tip 16b at the other, and a flexible shaft 16c extending from the tip 16b to a shank 16d which terminates at the enlarged head. The flexible probe 16 is an integral piece and the shaft 16c is adapted to flex about the junction 16e in any direction, with the tip 16b being displaced from its normal on-grid position as shown in FIGS. 2 and 23. The shaft 16c is designed so that its elastic limit is not exceeded during testing. If the shaft 16c is bent beyond its elastic limit, it will not return to its on-grid position.

Figure 9:
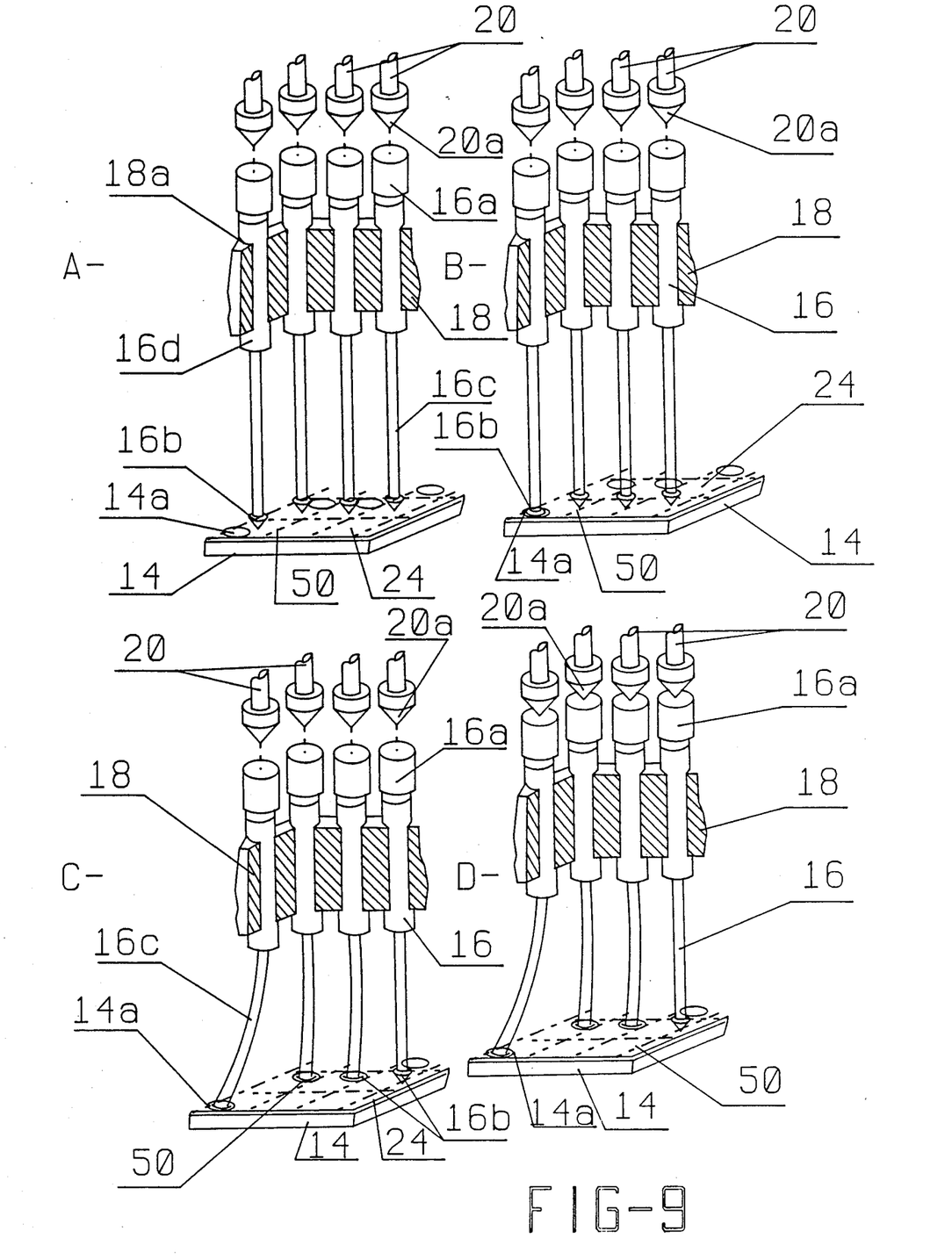
FIG. 9 illustrates the flexible probes sliding over the surface of a mask to make contact with test sites on a circuit board under test, showing the probes in four positions A, B, C, and D.

Each individual probe 16 fits through an opening 18a in the support plate 18, so that the enlarged head 16a will rest on the top surface of the plate, with the shank passing through the opening in the plate. Each probe 16 is positioned at the intersection of the X and Y coordinants of a grid as depicted in FIG. 23. In this embodiment, the X-Y coordinates are spaced apart by 0.100 inch. Other spacing, such as 0.050 inch may also be used. In a fully loaded system, for each flexible probe there is a corresponding wired probe 20 immediately above it with its tip 20a adapted to engage the center of the head 16a of the flexible probe 16 when the test probe is raised upwardly. (FIG. 9, position D.)

With the unit 14 being tested correctly positioned on the product locating table 22, the mask 24 is placed over the unit and positioned between the unit and support plate 18. The correct positioning of the unit 14 tested on the table 22 will be discussed in greater detail below. The purpose of the mask 24 is to present a barrier or stop between selected flexible probes 16 and the unit 14 being tested. The reason for this is that it is not necessary to use all of the flexible test probes 16 during testing of any particular unit 14. For example, a typical array of flexible probes 16 will contain 30,000 probes. The unit 14 being tested, however, may only have 20,000 test sites or holes 14. Thus, a mask 24 is made for each unit 14 being tested which provides an opening 24a for each flexible probe 16 to be used with the unit being tested. Where no opening is needed, the mask 24 will serve as a barrier which prevents an unneeded flexible probe 16 from engaging the unit 14. This mask 24 may be made out of Mylar and is drilled using, for example, a lazer, to form a pattern of holes 24a in the mask 24 corresponding to the hole pattern of the unit 14 being tested. The use of the mask 24 may be avoided, but this requires that the support plate 18 be loaded with the exact number of probes 16 corresponding to the number and position of test sites for the unit being tested.

Figure 1:
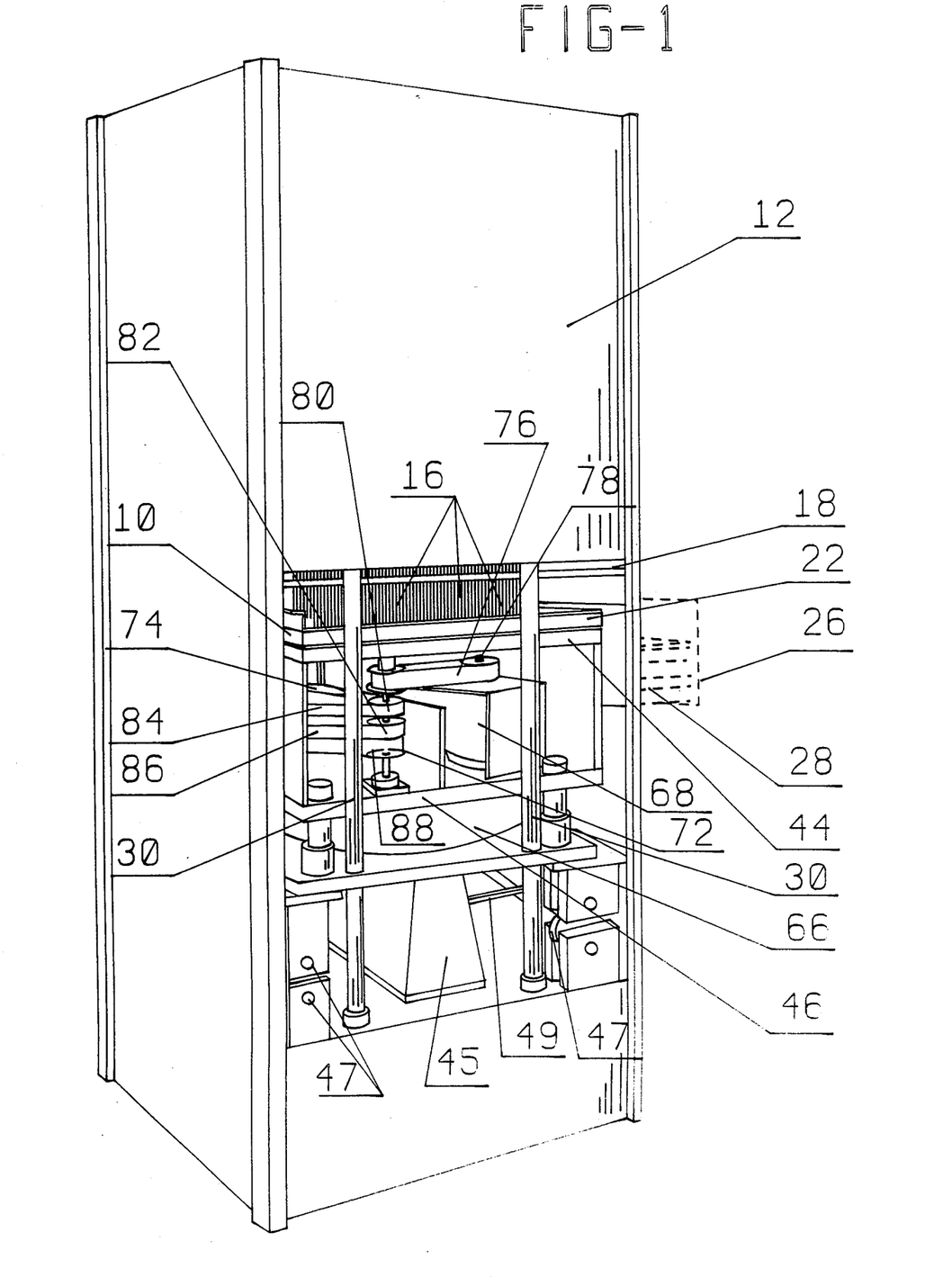
FIG. 1 is a perspective view, with a side panel removed, of an the test fixture of the present invention.

As best shown in FIGS. 1, 2, and 4, the unit 14 being tested is placed on the product locating table 22 which is carried by a drawer 26 that slides outwardly from the side of the cabinet 12. This drawer 26 is carried on rails 28 which are mounted on a pair of posts 30 housed within the cabinet 12. When the drawer 26 is pulled from the right hand side of the cabinet 12, as viewed in FIG. 1, it carries with it the product locating table 22. The rail 28 is secured to the side 26c of the drawer 26 and this rail rides over ball bearings (not shown) as the drawer is pulled in and out. On the surface 26a of the drawer 26 are locating tools 30 which are received in locating receptacles 32 carried on the outer underside edges of the product locating table 22. The interaction of the tools 30 and recepticles 32 enable the product locating table 22 to be pulled outwardly from the side of the cabinet 12 to load the board and may also be lifted upwardly when the locating table is within the cabinet 12, so that the unit 14 being tested can be raised into position to contact the tips 16b of the flexible probes 16.

As shown in FIG. 2, the mask 24 has along its edges receptacles 34 for bullet nose dowel pins 36 carried on the product locating table 22. This mask 24 is carried in a frame 38 which has opposed inverted L-shaped brackets 38 (only one shown) that have receptacles 38b that will engage tooling pins 40 carried on upright L-shaped bracket 42 mounted to the cabinet 12. When the drawer 26 is opened, this permits the user to have access to the mask 24. The user, with the drawer 26 open, removes the mask frame 38, which slides along the bracket 42, and places in the mass frame the desired mask 24. The user then places the mask frame 38 with the desired mask 24 into the cabinet 12 and slides the assembly of frame and mask along the brackets 42 until the receptacles 38b are opposite the tooling pins 40. Upon release, the assembly of frame and mask drops into the correct position relative to the flexible probes 16.

With the unit 14 being tested in position, a drive plate 44 is moved upwardly in respose to movement of a lift cam assembly 45 until the bullet nose dowel pins 48 in the drive plate 47 are received in receptacles 50 carried in the underside of the product locator table 22. The lift cam assembly 45 is seated on the base of the cabinet 12 and includes a pair of cams 47 that are rotated by a rack and pinnion gear 49. The cam assembly 45 supports a drive mechanism 46, which is moved up or down depending on the direction of rotation of the cams 47. The drive mechanism 46 includes the drive plate 44 which moves up and down as the drive assembly is raised or lowered by the cam assembly 45.

The drive plate 44 is moved upwardly, lifting the product locating table 22 off the surface 26a of the drawer 26, moving it upwardly until the bullet nose dowel pins 36 carried in the top of the table 22 engage the receptacles 34 along the edges of the mask 24. The assembly of the drive plate 44, product locating table 22, unit 14, and mask 24 is continued to be raised upwardly until the mask 24 engages the tips 16b of the flexible probes 16 and the probes 16 are lifted a slight distance above the top surface of the support plate 18. The upward movement, however, is stopped before the heads 16a of the flexible probes 16 engage the tips 20a of the wired probes 20. (The relationship between the heads 16a of the flexible test probes 16 and the wired probes 20 is best illustrated in FIG. 9 and will be discussed below in greater detail). When the assembly has been moved to this position, the tips 16b of the flexible test probes 16 are resting on the top surface of the mask 24 or they may have passed through an opening 24a in the mask and are positioned in a hole 14a in the unit 14.

With the tips 16a of the flexible probes 16 engaging the surface of the mask 24, or in a hole 14a, the test fixture 10 is now ready to go into a search mode. In the search mode, the drive plate 44 is actuated to move reciprocally in a horizontal plane in the X and Y direction simultaneously, although it could be moved sequentially. As depicted in FIG. 5, each point on the surface of the drive plate 44 thus moves back and forth along a predetermined path. Three alternate paths of movement of the plate 44 are illustrated. Path A illustrates a square wave movement, which is achieved when the table 22 moves aschronously. Path B illustrates a zig zag movement. And Path C illustrates a sinusodial movement, which is easiest to achieve.

Figure 6:
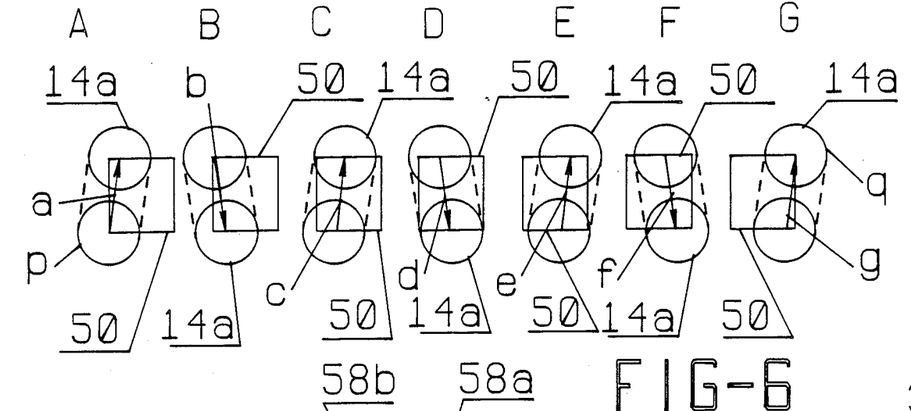
FIG. 6 is a schemmatic view illustrating the significant hole sweep positions in a typical search pattern.

The movement of the plate 44 moves the test sites or holes 14a through a pre-determined field of search. The field of search is defined as the area traversed by a test site as it moves through its path of travel. A field of search is best illustrated by FIG. 6, with the perimeter of a square defining the boundaries of the field of search 50 through which this hole 14a moves and the theoretical center of the field of search corresponding to the center of the square. As provided in one embodiment of this invention, the field of search is a square of 0.06 inch on each side. Assume the hole 14a starts in the dotted line location of position A in FIG. 6. First it moves along the vector a to the solid line location in position A, then from this location the hole moves along the vector b to position B. From this position B it moves along the vector c to position C, then along vector d to position D, and so on through a zig-zag pattern to the position G. When the drive plate 44 reverses direction, the hole 14a moves in a reverse direction from position G to F, then from position F to E, and so on to return to the dotted line location of position A.

Figure 7:
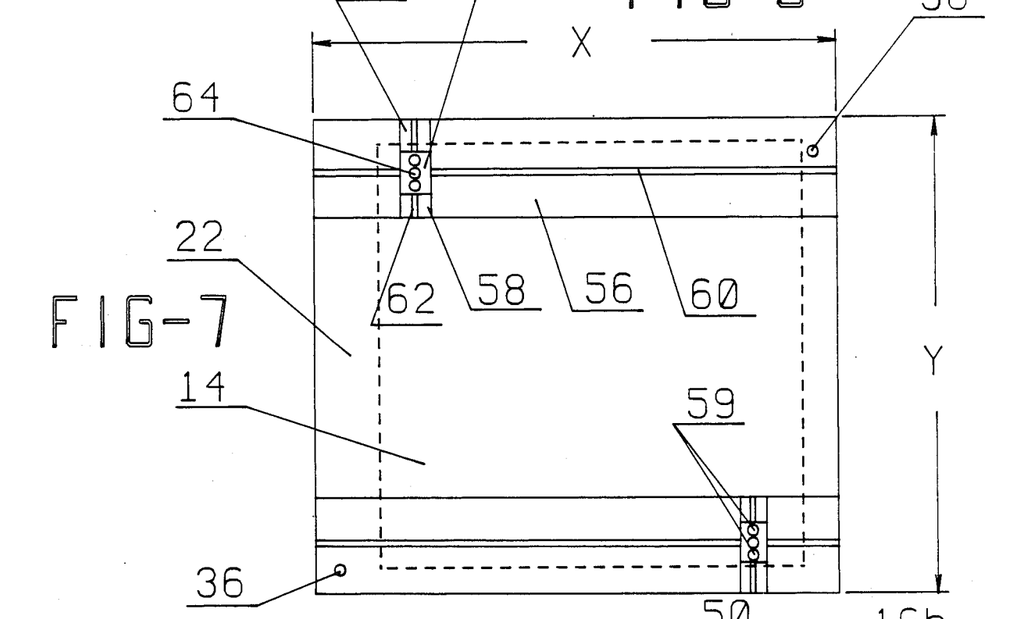
FIG. 7 is a plan view of the product locating table used in the present invention.

In accordance with an important feature of this invention, the unit 14 must be properly placed on the product locating table 22 to ensure that each flexible probe 16 is captured by the test site or hole 14a which it has been programed to test. As shown in FIG. 7, a conventional product locator 56 is used to accomplish this. The product locator 56 includes a pair of block assemblies 58 mounted to move along the top of the table to different positions to accommodate different size units. Each block assembly includes two blocks 58a and 58b, with the smaller block 58a being screwed by screws 59 to the top of the larger block 58b. The larger block 58b includes a rail (not shown) which slides along a slot 60 in the top surface of the table 22, moving in the X direction. The smaller block 58a includes, on its underside, a rail (not shown) which slides in a slot 62 in the top surface of the larger block 58b. These slots 60 and 62 are at right angles to each other. Thus, the smaller block 58a moves in the Y direction and the larger block 58b moves in the X direction. The screws 59 must be loosened in order to move the small block relative to the large block. Each block assembly 58 carries a locating pin 64 which fits into an apperture 14b (FIG. 4) in the unit 14. These block assemblies 58 are moved to the correct position and the blocks 58a and 58b are adjusted to position so that the theoretical center of the field of search is not dispose equidistant between two probes.

Positioning of the Unit Under Test

One must bear in mind that each flexible probe 16 is designated to locate a particular test site 14a on the unit 14 under test. Only one test site or hole 14a may capture one probe 16. To insure that each probe is captured by the correct hole, the unit 14 is correctly positioned under the array of probes 16. Proper adjustment of the product locator 56 in relation to a fixed reference accomplishes this.

The reference used is a straight line which is perpendicular to the plane of the table 22 and intersects the table. This line would also intersect the support plate 18 which has a fixed position in space. The drive mechanism 46 for the table 22 is constructed so that the table 22 always returns to the same position after completing its movement. Thus, the positional relationship between the table 22 and support plate 18 will be known when the assembly of mask 24 and unit 14 is initially placed on the table 22. The product locator 56 is then adjusted in relation to the reference line to present the unit 14 to the array of flexible probes 16 in a manner which insures that the correct probe is captured by the correct test site 14a with each test site having an assigned field of search. To accomplish this, the unit 14 is placed on the table 22 so that each field of search 50 is beneath the probe to be captured by the test site 14a moving therethrough. Care is taken so that each field of search is not centered between two adjacent probes.

Figure 8:
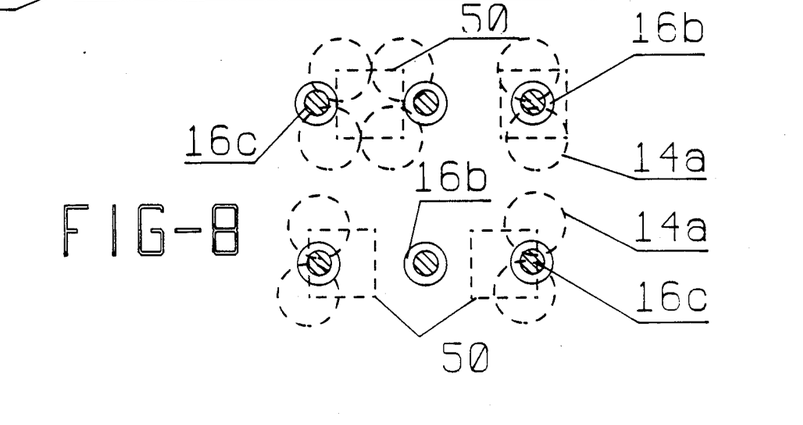
FIG. 8 is a schemmatic view showing incorrect and correct positioning of the field of search relative to two adjacent flexible probes. Position A is the incorrect position; position B is the correct position.

The position of the unit 14 on the table 22 determines the location of the field of search 50 in relation to the tips 16b of the flexible probes 16. When the unit 14 is placed on the surface of the table 22, the field of search 50 for each hole 14a is established. If the board 14 is placed on the table 22 so that the theoretical centers 50b of the fields of search are equidistant between adjacent probes 16c and 16d, as shown in FIG. 8, position A, then either of these probes 16c or 16a could be captured by the hole 14a as it moves through the field of search 50. This is unacceptable, because only one of these probes 16c or 16d is the designated probe to be captured by the hole 14. The correct way to position the unit 14 on the table 22 is shown in FIG. 8, position B. Here the unit 14 is placed on the table 22 and the product locator 56 is adjusted to move the unit 14 in relation to the table 22 so that the theoretical center 50b of each field of search of a hole 14a is closest to the probe 16c to be inserted into this hole, as illustrated in FIG. 8, position B.

As best shown in FIG. 9, position A, the flexible test probes 16, being raised off the support plate 18, have their tips 16b adjacent the holes 24a in the mask 24 in which they are to be inserted. As the unit 14 being tested moves through its field of search 50, the one hole 24a will move past the tip 16b of the test probe, with this tip 16b sliding over the surface of the mask 24 until it is opposite the hole 24a, whereupon, under the force of gravity, the probe drops into the hole. This is illustrated in FIG. 9, position B. When all of the holes 24a have found their designated probes 16, the continued movement of the drive plate 44 causes the shafts 16c of the probes to bend or flex. This is illustrated in position C. However, the movement of the drive plate 44 is carefully controlled so that the distance it travels will never result in the shaft 16c being bent beyond its elastic limit. Consequently, when the test is completed, the flexible shaft has sufficient resiliency to return to its on-grid position, as illustrated by position A.

When the probes are all properly positioned within their respective holes 24a, an air bag 66 (FIG. 11) is inflated, causing the assembly of drive plate 44, product locating table 22, unit 14, and mask 24 to move again in an upwardly direction until the tips 20a of the wired probes 20 engage the heads 16a of the flexible probes as shown in FIG. 9, position D. The tips 16b of the flexible probes are also pushed firmly into the holes 14a so that these tips make electrical contact to complete a circuit between the wired probes 20, flexible probes 16, and test sites 14a. When the electrical test is completed, the air bag 66 is deflated and the cam assembly 45 is again actuated to return the drive plate 44, product locating table 22, mask 24, and unit 14 to the position shown in FIG. 2.

Drive Mechanism

Figure 10:
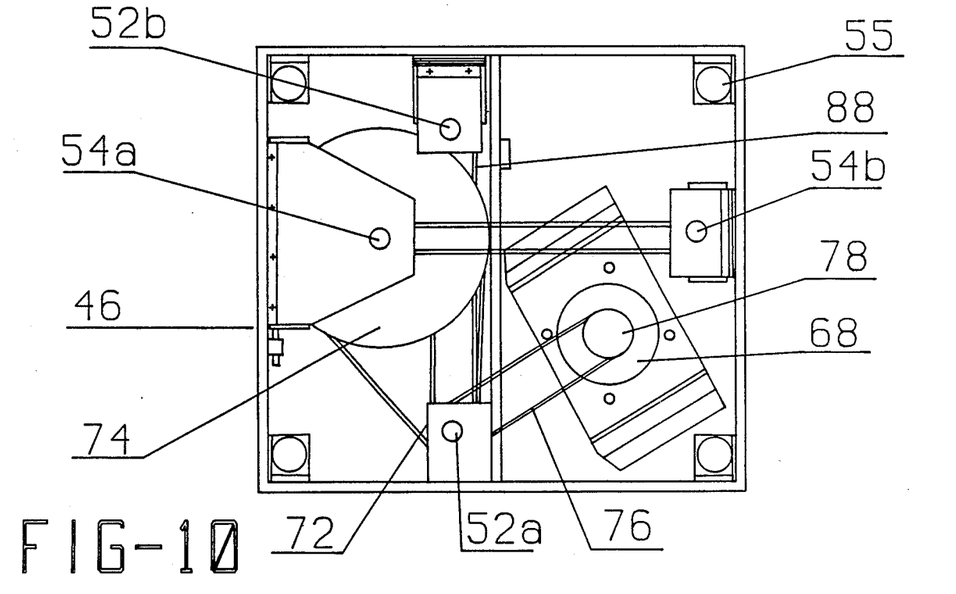
FIG. 10 is a cross-sectional view taken along line 10—10 of FIG. 11.
Figure 11:
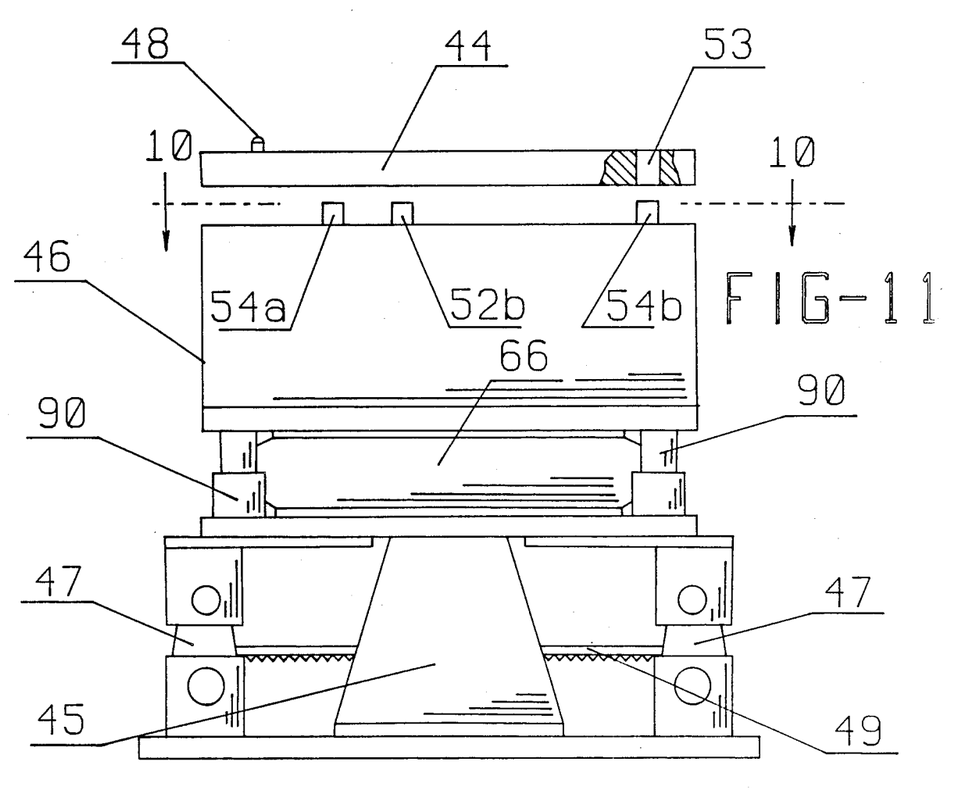
FIG. 11 is a side elevational view of the cam assembly and drive mechanism of the present invention.

The drive mechanism 46 for the test fixture 10 is best illustrated in FIGS. 1, 10 and 11. This drive mechanism 46 is carried on posts 90 and it includes a motor 68 mounted on a support plate 70 carried within the cabinet 12. High speed cams 52 and low speed cams 54 are driven by this motor 68 through, respectively, high speed drive sprockets 72 and low speed drive sprockets 74. The drive belt from the shaft of the drive motor 68 is connected to the drive shaft of the high speed drive sprocket 72. The shaft of the high speed drive sprocket 72 carries the high speed cam 52 and the sprokets 80 and 82 which, through drive belts 84 and 86, turn the low speed drive sprockets 74. A belt 88 extends between the sproket 72 to a sproket (not shown) to turn the high speed cam 52b. When the lift cams 47 move the assembly of drive plate 44, product locator table 22, unit 14 being tested, and mask 24 to the elevated position where the search is conducted, the ends of the cams 52 and 54 are inserted into opening 53 (only one shown) in the drive plate 44. This plate 44 is supported on a cushion of air provided by conventional air bearings 55 at the corners of the drive mechanism 46. The drive motor 68 is now turned on to move the drive plate 44, translating it simultaneously in the X and Y direction as depicted in FIG. 5. This drive plate 44 only moves a short distance of 0.060 inch and it does this very rapidly to go through three cycles per second. When the search pattern has been completed, the drive motor 68 is disengaged and, as mentioned above, the air bag 66 is inflated to move the entire drive mechanism 46 upwardly until the heads 16a of the flexible probes 16 engage the wired probes 20. When the electrical test is completed, the air bag 66 is deflated to lower the drive mechanism 46.

Probe Design

As best shown in FIG. 6, the probe 16 is capable of flexing about the point of connection of the shaft 16c to the shank 16d. The tip 16b is captured by a hole 14a and the shaft 16c flexes as the hole moves through its search pattern. In accordance with this invention, the shaft 16c is designed so that it will not exceed its elastic limit as the hole 14a moves through its maximum displacement in any direction. For example, if the tip 16b is captured by the hole 14a in position A, dotted line, and the hole moves to position G, solid line, through the distance from p to q, the shaft in position A will be in an unflex condition, then flex laterally and outwardly so that the tip moves to position G, and, upon release from the hole, spring back to its unflex condition, with the tip returning to position A.

The probe tips are carefully designed to insure that the correct probe is captured by its corresponding hole, electrical contact is achieved, and adjacent probes do not contact each other during the search mode. The following discussion assumes that the probes are on an X-Y grid and the distances between the adjacent probe centers are at the intersections of the coordinates as illustrated in FIG. 23. Two different type probe tips 16c may be used: Probe tip A, for use with plated through holes as shown in FIG. 15, and probe tip B, for use with a mask as shown in FIG. 14.

Figures 12, 13, 14, 15, 16, 17, 18:
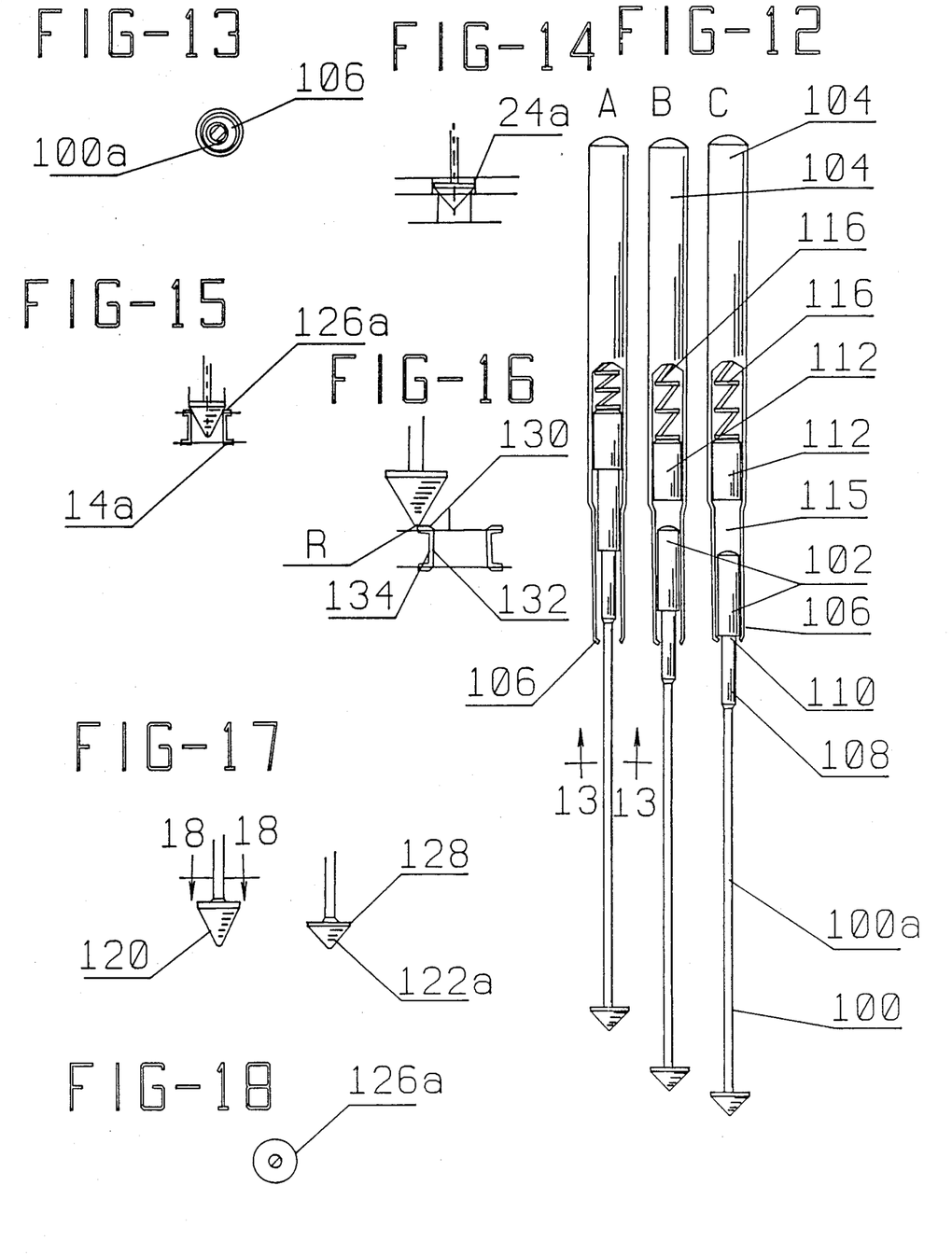
FIG. 12 illustrates an alternate embodiment of the flexible probe of the present invention, showing it in three positions A, B, and C.
FIG. 13 is a cross-sectional view taken along line 13—13 of FIG. 12.
FIG. 14 is an enlarged view of the tip of a flexible probe being inserted through an opening in a mask.
FIG. 15 is an enlarged view of the tip of a flexible probe being inserted into a hole in a circuit board lined with metal sheathing.
FIG. 16 is an enlarged view of the tip of a flexible probe riding over a tracing on the surface of a circuit board.
FIG. 17 illustrates two different types of tips used by the flexible probes, tip A and tip B.
FIG. 18 is a cross-sectional view taken along line 18—18 of FIG. 17.

Referring to FIG. 17, there is shown the probe tip A, which is shaped as a cone and has a base 126. The base 126 of the conical tip A has a diameter 126a which is greater than the diameter of the hole 14a (FIG. 15) in which the tip is to be inserted. The side 120 of the conical portion of the tip forms an acuate angle with the axis of the shaft 16c. In the case of tip A, the angle is equal to 30°. Tip B is similar to tip A. The principal difference being that the angle of the side 122A of the tip B with respect to the axis of the shaft 16c is 45° instead of 30°. Where the side 122 meets the base 126, there is provided a flat portion 128. This flat portion 128 acts as a gripping surface for holding the tip B an opening 24a as shown in FIG. 14.

The tip A is used with plated through holes as illustrated in FIGS. 15 and 16. When the hole 14a moves through its field of search 50, the tip A, because of its acute angle of 30°, rides over trace elements 130 on the surface of the unit 14 as shown in FIG. 16. The radius R of tip A is sufficiently large to prevent the tip from penetrating in the surface of the mask 24 or unit 14 as the case may be. When the center of the hole 14a passes beneath the tip A, the flexible probe 16 falls into the hole 14a. Gravity pulls the tip A into the hole 14a, with the side 120 making electrical contact with the sheathing 132 covering the wall 134 defining the hole 14a.

Figures 19, 20:
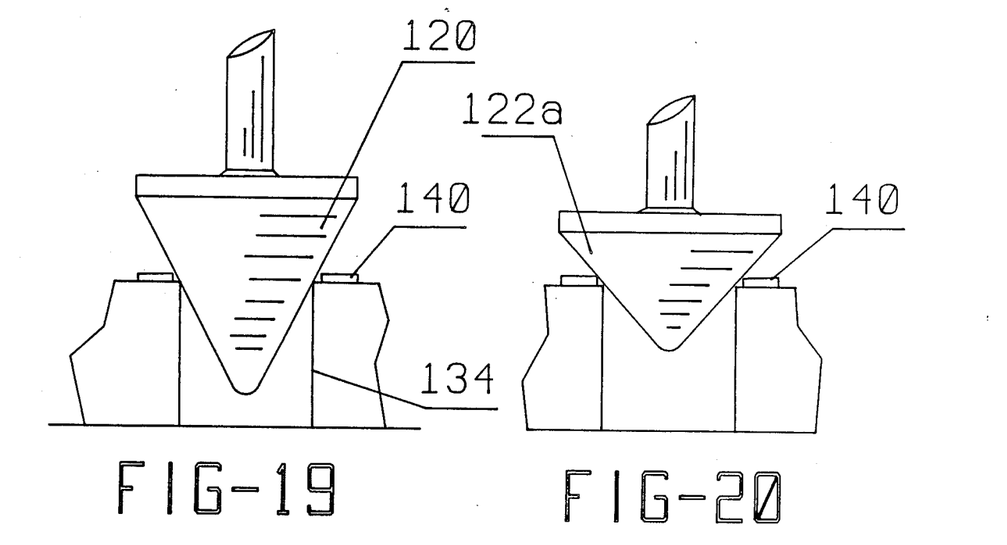
FIG. 19 is an enlarged view of tip A inserted into a hole in a circuit board having a conductive ring surrounding the mouth of the hole.
FIG. 20 is an enlarged view of tip B inserted in the same hole as that shown in FIG. 19.
Figures 21, 22:
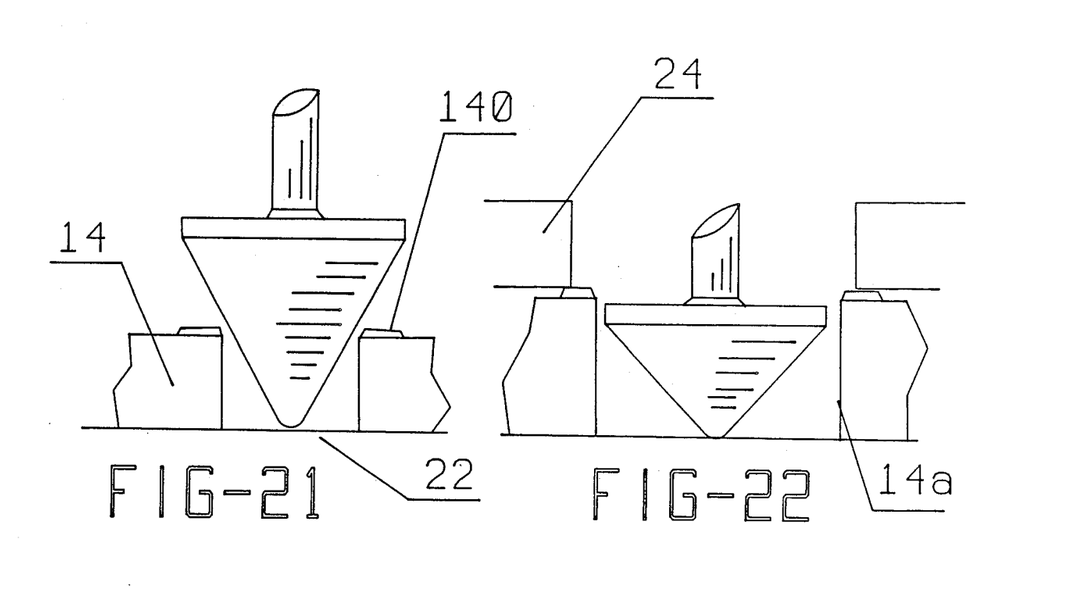
FIG. 21 is an enlarged view of tip A inserted into a hole in a circuit board which as insufficient thickness.
FIG. 22 is an enlarged view of tip B where the diameter of the base of the tip is too small.

The tip B is used with non-plated through holes as illustrated in FIGS. 14, 20 and 22. In such cases, the unit 14 only has its perimeter 136 surrounded with a metal ring 140. The bore wall 134 is exposed, being made of an insulating material. In the manufacture of circuit board, the metal ring 140 is formed by a process that includes the step of etching away unwanted metal using an acid. The acid dissolves some of the metal ring 140 so that the edge of the annulus is set back slightly from the mouth of the hole as shown in FIGS. 19 and 28. Because of this setback, the side wall 120 of the tip A, with its acute angle of 30°, will not in many cases contact the ring 140. As shown in FIG. 19, tip A only contacts the bore wall 134 and not the metal ring 140. Consequently, the tip A is unsuitable for use in such instances. In contrast, tip B, with the side wall 122 being at a less acute angle of 45°, contacts the metal ring 140 notwithstanding the setback. This is illustrated in FIG. 20.

When the tip B is used, provision must be made to insure that it will remain captured in the hole 14a during movement of the table 22. Because the side wall 122 is highly slanted relative to the mouth of the hole 14a, the tip B could slide from the hole. Consequently, the mask 24 is always used with this tip B. When the tip B is seated in a hole 14a, the flat portion 128 is lodged in the hole 24a in the mask 24 as shown in FIG. 14. Thus, the tip 122 will not slip from the hole 24a, because the flat portion 128 will abut the bore wall 123 of the hole 24a in the mask 24.

The diameter of the hole 14a in the unit 14 must also be considered in designing the tip 16c of the probe 16. If the diameter of the hole is too large in relation to the diameter of the base 126 of the tip of a probe, proper electrical contact will not occur. When the array of probes 16 are positioned in a grid configuration having 0.100 spacing between coordinates as shown in FIG. 23, the diameters of the holes must not exceed 0.045 inch and the holes must not be less than 0.100 inch apart as measured along the X and Y coordinates of the grid (FIG. 23). When the array of probes 16 are positioned in a grid configuration of 0.050 inch, the diameters of the holes must not exceed 0.0225 inch and the holes must not be less than 0.050 inch apart again as measured along a coordinate of the grid. In other words, the critical relationship is that the diameter of the base of the tip must not exceed 45% of the minimal distance between adjacent coordinates.

Figure 24:
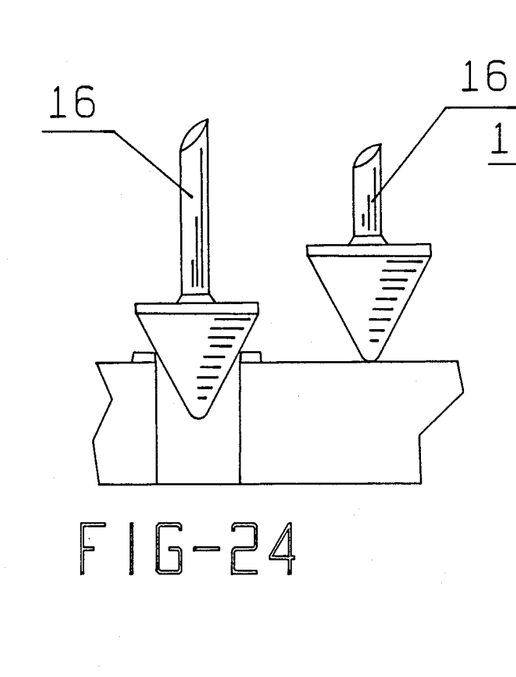
FIG. 24 shows two adjacent flexible probes, one in a hole with the hole moving through its field of search and at position D as shown in FIG 6.
Figure 25:
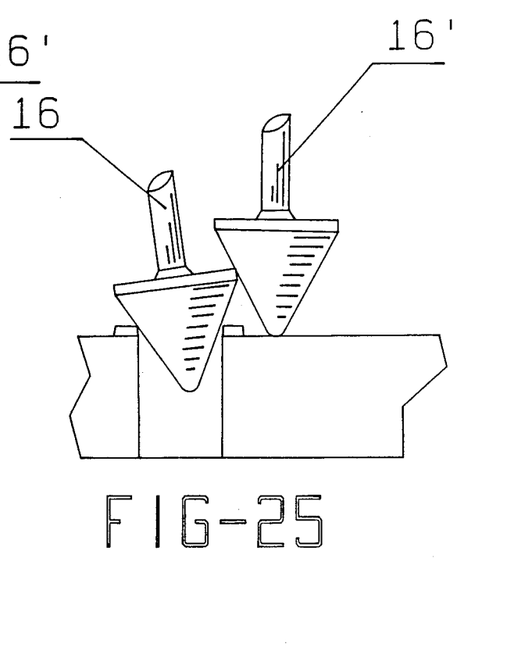
FIG. 25 shows the same two adjacent flexible probes as shown in FIG. 24 except the one probe is now in position G as shown in FIG. 6.

This problem of hole diameter can best be understood by considering FIG. 6, FIGS. 24 and 25. In FIG. 6, the diameter of the hole is 0.045 inch and the distance this hole moves along the X and Y coordinates is 0.06 inch. As the hole moves from the dotted line location of position A to location of position G, it travels along the X coordinate, as measured between points p and q on the circumference of the hole, a total distance of 0.105 inch. The hole captures tip A with a base 126 having, for example, a diameter in excess of 0.045 inch. Assume the tip A is captured by the hole as it moves into the center position D. The relationship of adjacent probes 16 and 16' at this instance is shown in FIG. 24. As the tip A moves into position G, the relationship of the probes 16 and 16' is shown in FIG. 25. The probe 16' has not been captured in a hole so its position has not changed, being in its original position D. The probes 16 and 16' contact because the diameter of the base of the tip A exceed 0.45 inch, or 45% of the spacing between adjacent coordinates.

Two other undesirable conditions are illustrated in FIGS. 21 and 22. FIG. 21 shows tip A contacting the product locating table 22 before contacting the ring 140. Here the height of tip A is excessive in relation to the thickness of the unit 14 being tested. FIG. 22 shows tip B having a diameter less than the diameter of the hole 14a. Therefore, it fails to make electrical contact. In both of these cases, an invalid test would occur.

Operation

The test fixture 10 has basically three distinct positions. A load position, a search position, and an electrical test position. In the load position, the drawer 26 is pulled from the right hand side of the cabinet 12, as viewed in FIG. 1, and the unit 14 being tested is placed on top of the product locating table 22. The block assemblies 58 are being adjusted manually so that when the drawer 26 is closed, the unit 14 is correctly presented to the array of flexible test probes 16 to insure that only the designated probe is captured by its corresponding test sit The mask 24 has previously been placed in position over the unit 14 and it has the correct number of openings in it which correspond to the number and location of the test sites selected to be tested. FIG. 2 illustrates the unit 14 being tested in position on the top of the product locating table 22 after the drawer has been closed. The test fixture 10 is now ready to be moved to its search position.

To move to the search position, the lift cams 47 are rotated so that the drive plate 44 is moved in an upwardly direction until it engages the underside of the product locating table 22 to lift this table off the top edge of the drawer 26 and upwardly so that the unit 14 will engage the underside of the mask 24 and lift this mask upwardly towards the tips 16b of the probes 16. The cam assembly 45 moves the assembly of drive plate 44, product locating table 22, unit 14, and mask 24 upwardly to raise the flexible probes 16, lifting them from the apertures 18a in the support plate 18. The upward movement continues until the heads 16a of these probes are displaced a slight distance away from the top of the support plate 18 but do not engage the tips 20a of the wired probes 20. The test fixture 10 is now in the search position.

In the search position, the drive mechanism 46 is actuated to move the unit 14 through a search pattern. In other words, each individual hole 14a or test site is moved along, for example, a zig zag path through the field of search 50. Each individual test site defined by an opening 24a in the mask 24 moves into position opposite the probe 16 designated to test this site. At this point, the probe 16, under the force of gravity, falls through the opening 24a into the hole 14a. It will be held in this hole 14a, provided that the movement of the hole is limited and the probe tip 166 is correctly designed. When the probe 16 drops into the hole 14a and is captured by it, the further movement of the hole will cause the flexible shaft 16c to bend, as shown in FIG. 9, position C. Again, the movement of the hole 14a is limited so that the shaft 16c is not bent beyond its elastic limit. With the flexible probes 16 all correctly positioned in their respective holes, the airbag 66 is inflated to move the assembly of drive plate 44, product locator table 22, unit 14, mask 24, and array of probes 16 upwardly to the electrical test position where the tips 20a of the wired probes 20 engage the heads 16a of the flexible probes as shown in FIG. 9, position D. Current is then passed through the wired probes 20, flexible test probes 16, and test sites to test the circuit. When the electrical test is completed, the air bag 66 is deflated and the lift cams 47 are actuated to return the test fixture 10 to the position shown in FIG. 2.

Alternate Embodiment

FIG. 12 shows an alternate embodiment of this invention wherein the wired probe and flexible probe are combined in a single unit. The use of such a combined probe system will eliminate the support plate 18 and the need for two sets of probes. In some instances, this could greatly simplify the construction of the test fixture 10, enabling, for example, a fixture to be constructed with the probes pointed upwardly or on their side.

In this embodiment, a flexible probe 100 similar to the probe shown in FIG. 3 is used, except that the head 102 of the probe is carried within a housing 104. This probe 100 has a flexible shaft 100a which pivots through 360° about its junction 100b with a shank 108. This housing 104 has an open end through which a portion of the shank 108 may pass. An intermediate portion of the shank 108 has a raised stop element 110 which engages the lip 106 of the openend and prevents the probe from moving downwardly any further. The furthest the flexible probe 100 may move in a downwardly direction is shown in FIG. 12, position C. This flexible probe can move upwardly within the housing until it engages a piston-type member 112 which is carried in the upper portion of the housing. This piston-type member 112 can move within the upper portion of the housing 104, but its downward movement is limited by a restricted neck portion 113 in the housing. There is a coil spring 116 disposed between the piston type member and the upper end of the housing 104. This spring 116 is compressed as the probe moves upwardly, as shown in FIG. 12, position A.

The use of this probe with the test fixture illustrated in FIGS. 1 and 2 will permit the unit 14 to move from a load position, where the flexible probe would be in position C, to a search position, where the flexible probe 100 is in the position B. With the flexible probe 100 in the search position B, the drive assembly would be actuated to move the drive plate through the search pattern depicted in FIG. 5. When the search was completed, then the airbag would be inflated to lift the probe to position A, where electrical contact is made, and the electrical test is conducted. During searching, the probe will not be bent to the point where it would contact the lip 106.

This probe 100 could be used with its position inverted or on its side. In this case, a spring 115 (shown in dotted lines) would be placed between the head 102 and member 112. The spring 115 acts as a substitute for gravity, forcing the tip of the probe into its designated hole during the search mode. The strength of the spring does not exceed the force of gravity, and is always substantially weaker than the spring 116. This enables the tip to slide freely over the surface of the mask 24 or unit 14 without binding.

SCOPE OF THE INVENTION

The above description presents the best mode contemplated of carrying out the present invention, as depicted by the different embodiments disclosed. The combination of features illustrated by these embodiments provide the advantages of this invention. This invention is, however, susceptable to modifications and alternate constructions from the embodiments shown in the drawing and described above. Consequently, it is not the intention to limit it to the particular embodiments disclosed. On the contrary, the intention is to cover all modifications and alternate constructions falling within the scope of the invention, as generally expressed by the following claims:

I claim:

1. A test fixture adapted to electrically test a unit which has on-grid and off-grid test sites defined by holes, including
    a plurality of flexible probes arranged in an on-grid configuration, with each probe being free to bend, moving from its on-grid position to an off-grid position,
    table means providing a generally flat surface, said table means being adapted to move so that the surface is translated in two directions in the same plane,
    means for positioning the unit to be tested on the surface of the table means so that the test sites are presented to the probes for testing and individual probes will slip into the holes that they are to engage when the table means is moved,
    means for bringing the probes into engagement with the unit being tested and making mechanical contact between the probes and the unit, said probes, upon movement of the table means, being adapted to slide so that each test site is contacted by the probe nearest it slipping into the hole defining said test site,
    means for moving the surface in said two directions in a predetermined manner, each probe slipping into the hole defining the test site it is to contact, with the distance said surface move in each direction being within a predetermined maximum so that the probe, upon slipping into a hole, is not bent with the movement of the table beyond its elastic limit and, thereby, upon disengagement of the probes and the unit, the probes return to their on-grid position,
    means for bringing the probes and unit into electrical contact after the probes have been positioned in their corresponding holes, and
    means for disengaging the probes and unit after conducting the electrical test.

2. The test fixture of claim 1 wherein each probe is at an intersection of grid coordinates, with parallel grid coordinates being apart from each other a distance of 0.100 inch.

3. The test fixture of claim 1 wherein each probe is at an intersection of grid coordinates, with parallel grid coordinates being apart from each other a distance of 0.050 inch.

4. The test fixture of claim 1 wherein each probe includes a flexible shaft having at one end a head member which is adapted to contact means for passing an electrical current through the probe and at its other end a conical tip.

5. The test fixture of claim 4 wherein the conical tip has a side wall and the side wall of the conical tip and the axis of the shaft form an angle ranging between 0° and 60°.

6. In a test system for electrically testing a generally planar unit which has randomly located test sites defined by holes, the relative position of the test sites being ascertained by X and Y coordinates of a grid and each of said test sites either being at the intersection of the X and Y coordinates of the grid or offset intersections, said test sites being spaced apart a predetermined distance which is equal to or greater than the distance between the minimal spacing being parallel coordinates of the grid, the combination comprising:
    support means for supporting an array of probes, each of said probes passing through openings in the support means and having at one end an enlarged head which in one position rests against the support means and limits the movement of the probe toward the support means and in a second position is displaced away from said support means and at another end a tip,
    means for positioning the unit being tested adjacent the array of probes with only one probe being nominally aligned with one hole so that during testing the tip of said one probe is inserted into said hole and no other hole,
    means for bringing the unit being tested into contact with the array of probes and moving said unit in two directions in the same plane so that all the tips are captured in their respective holes and make electrical contact with the test sites, said movement of the unit being limited in any one direction to a distance that is less than the minimal distance between adjacent parallel coordinates of the grid, and
    means for passing electrical current through the probes when they are lodged within the holes.

7. The combination of claim 6 wherein the probes, each has a conical tip including a base the base of each conical tip has connected to it at the wall with the side wall of the tip and the axis of the shaft defining an acute angle ranging between about 0 and about 60°.

8. The combination of claim 7 wherein the movement of the unit being tested is limited so that, with the conical tips captured in the holes, the shaft is not bent beyond its elastic limit.

9. The combination of claim 6 wherein the support means comprise a generally flat plate disposed in a generally horizontal position and the probes are adapted to move in and out of the plate in a generally vertical direction.

10. A test fixture for electrically testing a generally planar unit which has randomly positioned test sites defined by holes, comprising:
    a rigid, horizontal support member having a plurality of parallel openings therein arranged to lie at the intersections of X and Y coordinates of a grid which is adapted to define the location of each individual test site in relation to each individual opening so that for each test site there is one and only one test site opposite one of said openings when the unit being tested is used with the test fixture,
    a plurality of probes, individual ones of said probes being disposed in individual ones of said openings, each of said probes having a flexible shaft and enlarged head member at one end of the shaft and a conical tip at the other end of the shaft, said enlarged head member normally resting on the support member and limiting the downward movement of the probe and said conical tip having a base which has a diameter larger than the diameter of the holes but less than the diameter of the opening so that the probe is insertable into the opening,
    table means providing a generally flat surface on which the unit being tested sits during testing, said table means being adapted to move vertically and horizontally asycronously, said table when moving horizontally moving each hole through a predetermined field of search, first means for vertically moving the table means from a load position where the unit being tested is placed on the table means to a search position where the conical tips of the probes engage the unit either directly or through a mask member and are raised so that the enlarged heads are lifted off the support member to a test position where the enlarged heads make electrical contact with the electronic test equipment, second means for horizontally moving the table means, with the table means movement being limited so that, with probes captured in holes, the flexible shafts bend but not beyond their elastic limit, and thereby, upon removal of the tips from the holes the shafts flex and return the probes to their respective on grid positions, and means for positioning the unit to be tested on the flat surface of the table means so that each test site is correctly aligned with the corresponding probe designated to engage the hole defining said test site, with the relative position between the surface of the table means and unit being such that the theoretical center of the field of search for each probe is not disposed equidistant between adjacent probes.

11. The test fixture of claim 10 wherein the conical tip has a side wall and the side wall of the conical tip and the axis of the shaft form an angle ranging between 0° and 60°.

12. In a test system to electrically test a unit having test sites defined by holes, including:

an array of flexible probes arranged in a predetermined configuration, table means for supporting the unit being tested, said table means being adapted to move in two directions in the same plane, means for positioning the unit being tested adjacent the array of probes so that during testing each probe will be lodged in a predetermined hole, means for mounting the probes so that said probes respond to relative movement between the probes and unit being tested to bring each probe into alignment with its predetermined hole and cause said probe to slip into said predetermined hole and engage and make electrical contact with the test site, means for moving the probes and the table means with the unit thereon relative to each other in a predetermined manner a predetermined maximum distance in any one direction so that the probes are not bent beyond their elastic limit, and means for passing electrical current through the probes when they are lodged in the holes.

* * * * *